United States Patent [19]

Staples

[11] Patent Number: 4,654,118

[45] Date of Patent: Mar. 31, 1987

[54] SELECTIVELY ETCHING MICROSTRUCTURES IN A GLOW DISCHARGE PLASMA

[75] Inventor: Edward J. Staples, Thousand Oaks, Calif.

[73] Assignee: The United States of America as represented by the Secretary of the Army, Washington, D.C.

[21] Appl. No.: 845,671

[22] Filed: Mar. 17, 1986

[51] Int. Cl.[4] .................. B44C 1/22; C03C 15/00; C03C 25/06

[52] U.S. Cl. ..................... 156/643; 29/25.35; 156/646; 156/659.1; 156/663; 156/904; 156/345; 204/192.32; 204/298

[58] Field of Search ............ 156/643, 646, 656, 659.1, 156/663, 904, 345; 204/192 E, 298; 427/38, 39; 29/25.35; 310/313 R

[56] References Cited

U.S. PATENT DOCUMENTS 3,410,774 11/1968 Barson et al. .................. 156/643 X Primary Examiner—William A. Powell
Attorney, Agent, or Firm—Sheldon Kanars; Jeremiah G. Murray; Maurice W. Ryan

[57] ABSTRACT

Selective etching of microelectronic devices comprising crystal substrates is achieved by electrically masking conductive areas thereon which are not to be etched by ionic bombardment. The electrical masking is accomplished by biasing the selected areas with a bias voltage which will repel the ions, which are attracted to all of the unbiased portions of the microelectronic device.

6 Claims, 4 Drawing Figures

SELECTIVELY ETCHING MICROSTRUCTURES IN A GLOW DISCHARGE PLASMA

The Government has rights in this invention pursuant to contract MDA903-81-C-0081, awarded by the Department of the Army.

BACKGROUND OF THE INVENTION

This invention relates to the fabrication of solid state crystal or microelectronic devices such as surface acoustic wave (SAW) devices. Such SAW devices may be used as high-Q resonators or as delay lines. In SAW devices the acoustic waves travel only along one surface of the crystal substrate, and thus high frequency operation can be achieved with a relatively thick crystal substrate, which is typically quartz. In bulk acoustic wave devices in which the entire crystal structure vibrates, high frequency operation can be achieved only by reducing the crystal thickness. Such thin crystals are fragile and subject to flexing in use from such environmental factors as shock and acceleration.

A known type of SAW resonator comprises a relatively thick quartz substrate with a pair of interdigital transducers (IDTs) located near the center of one of the broad surfaces of the substrate, with a grooved array reflector at each end of the same substrate surface, symmetrically located with respect to the two IDTs. The grooved arrays are efficient reflectors of surface acoustic waves for a band of frequencies determined by the groove spacing and groove depth. The IDTs are relatively wideband and are used for coupling to the electricl circuit. The electrical signal applied to the metallic IDTs strains the quartz substrate to generate the surface acoustic waves. The IDTs comprise an interdigital pattern of conductors with an overlap pattern chosen to couple energy only to the fundamental mode of the high-Q Fabry-Perot cavity formed by the two grooved array reflectors. The spacing of the grooves in the arrays thus determines the resonant frequency. The reflector arrays each comprise a plurality of parallel grooves which are usually formed in the substrate by etching away material between an array of parallel strips of masking material. These masking strips may be aluminum which is formed on the substrate by photolithography techniques. After the grooves are etched the aluminum strips are usually removed. The IDTs are usually formed during the same photolithography process by which the aluminum masking strips are formed, and thus it is necessary to somehow mask the IDTs from the etching step which forms the grooves of the reflector arrays. In the prior art, the IDTs have been covered with a resist material which shielded the IDTs from the bombarding ions which were used to etch the grooves of the reflector arrays. After this etching step in the prior art, the resist material had to be removed. A description of this prior art method appears on pages 138-139 of the book "Precision Frequency Control", edited by Gerber and Ballato, Academic Press, Inc., 1985. The present invention comprises an improvement of this fabrication method which makes the use of this masking resist material unnecessary.

SUMMARY OF THE INVENTION

The invention relates to a novel method of selective etching of features on a crystal substrate by means of ionic bombardment in an etching chamber in which a glow discharge is maintained to produce a plasma comprising positive ions. The ions may be reactive in which case etching takes place by a combination of ion bombardment and the chemical reaction of the ions with the crystal material being etched. In the practice of this method the crystal substrate is placed on the cathode in the etching chamber. If a SAW resonator of the type described is being fabricated, it will have the metal IDTs already deposited thereon, for example by photolithography, as well as the pattern of masking material which covers the area between the grooves which are to be etched. During the etching of the grooves which will form the reflector arrays of the SAW resonator, in accordance with the invention, the IDTs are protected from the bombarding ions by being positively biased. This positive bias repels the positive ions which are attracted to all of the unbiased parts of the substrate, which attract the positive ions since the substrate is in effect part of the cathode of the glow discharge chamber.

It is thus an object of this invention to provide a method of fabricating solid state microelectronic devices by means of ion etching or reactive ion etching, which method comprises the electrical masking of metallic areas which are not to be etched, by positively biasing such metallic areas relative to the potential of the cathode on which the microelectronic device substrate is resting.

Alternately stated, the invention comprises a method of electrically masking selected conductive areas on the microelectronic crystal substrate which is being ionically etched by means of a plasma produced by a glow discharge, so that such selected areas are not etched.

These and other objects and advantages of the invention will become apparent from the following detailed description and the drawings.

DETAILED DESCRIPTION OF A PREFERRED EMBODIMENT

Figure 1:
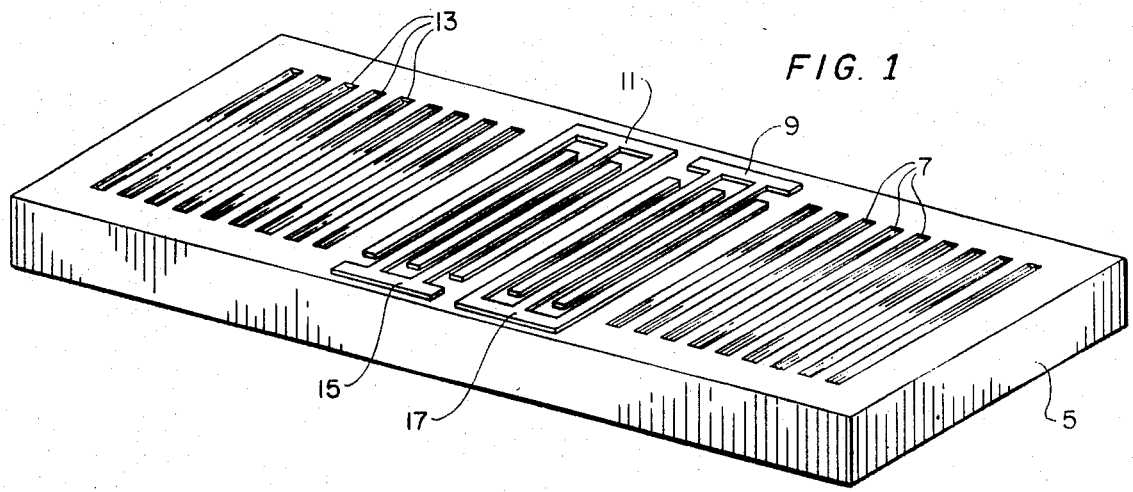
FIG. 1 shows a SAW resonator of the type which can be fabricated using the method of the present invention.

The surface acoustic wave resonator of FIG. 1 comprises a relatively thick substrate 5 of quartz. The upper broad surface of this rectangular block of quartz has a pair of IDTs arranged near the center thereof. These IDTs comprise relatively wide-band transducers adapted to be connected to an external electrical circuit and to launch the acoustic waves in the upper surface of the substrate, in both directions, toward the grooved array reflectors 7 and 13 on either side thereof. One of the IDTs comprises the conductor pattern 9, shaped like the Greek letter Pi, with the W-shaped pattern 17 interdigitated therewith, as illustrated. The other IDT comprises two similar pattern 11 and 15, similarly interdigitated. In the illustrated resonator, each of the reflector arrays, 7 and 13, comprises nine parallel grooves which have been etched into the surface of the substrate 5. These grooves are usually etched in a glow discharge chamber of the type described, where the substrate is subjected to positive ion bombardment while the areas between the grooves of the array are masked. The mask may comprise a parallel array of aluminum strips with a spacing between strips equal to the width of the desired grooves of the reflector array. As stated above, such a masking array is usually fabricated by conventional techniques at the same time that the aluminum IDTs are formed. Thus during the plasma etching of the reflector array grooves, the IDT electrodes and the quartz around them must be masked from ion bombardment.

Figure 2:
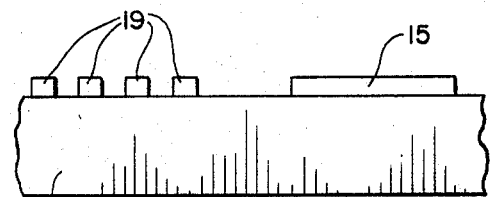
FIGS. 2 and 3 are end views of a SAW resonator such as that of FIG. 1 during two stages of its fabrication.
Figure 3:
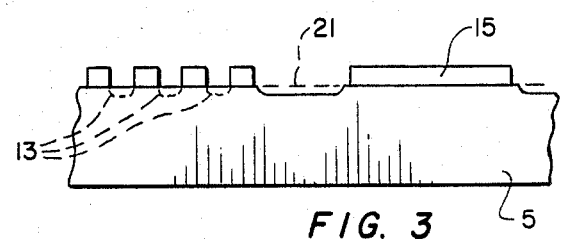
Figure 4:
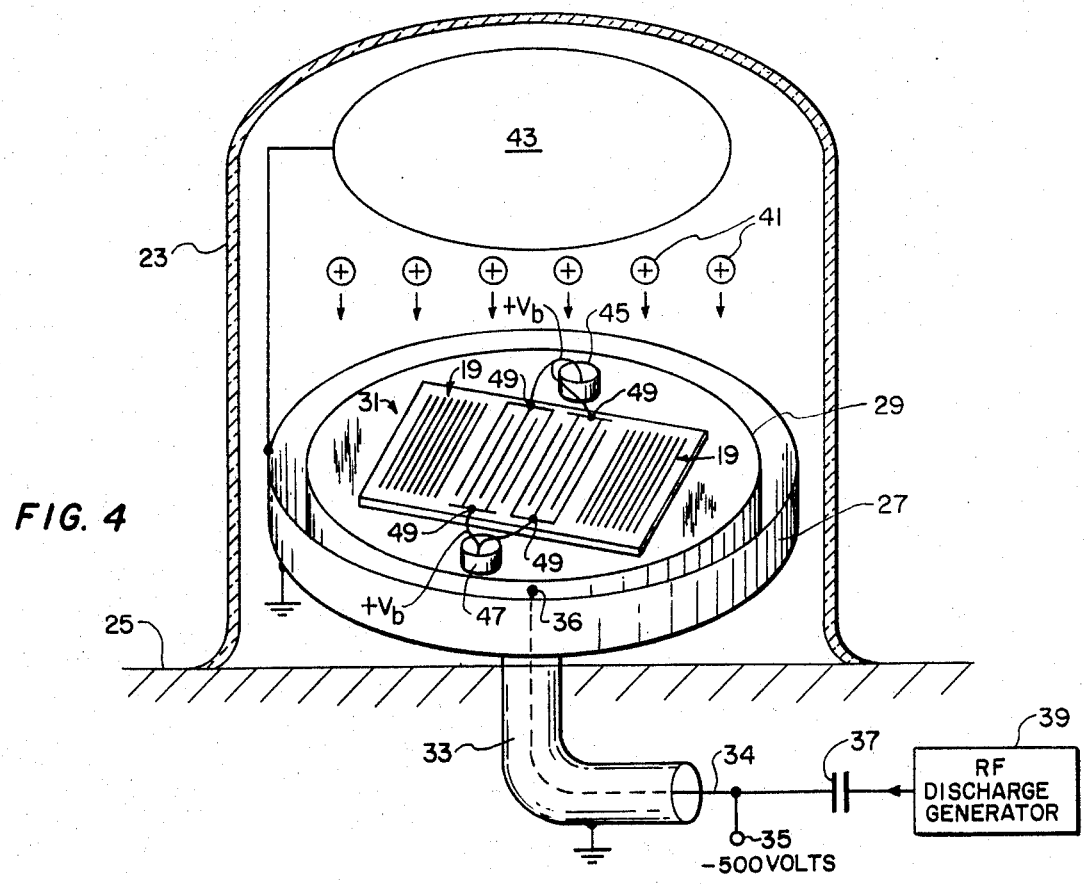
FIG. 4 shows a glow discharge etching chamber which may be used to practice the present invention.

FIG. 2 shows an end view of a portion of the resonator of FIG. 1, showing the parallel conductive strips which form the aforementioned mask for the etching of the grooves 13. The IDT 15 is also shown in FIGS. 2 and 3. FIG. 2 shows the resonator before the etching of the grooves 13 in the apparatus of FIG. 4, and FIG. 3 shows the resonator after its processing in the apparatus of FIG. 4, with the groove array 13 ionically etched therein. The dashed line 21 in FIG. 3 represents the original upper surface of the substrate 5. It can be seen that this upper surface has been eroded or etched except where it was protected by the mask 19 and by the positive bias applied to all of the IDT electrodes.

The apparatus of FIG. 4 comprises a bell jar 23 which rests on a flat surface 25. The inside of the jar has been evacuated and filled with a suitable gas at low pressure which serves as a source of ions when a glow discharge is set up therein. The cathode 29 comprises a cylinder which is neated inside of a larger grounded cylinder 27 which is at the same potential as the anode 43. The anode 43 and cylinder 27 are connected to the outer conductor 33 of a coaxial cable, which is ground for the minus 500 volt dc power supply 35 which is connected to the inner conductor 34 of the coaxial cable. Inner conductor 34 is also connected to cathode 29 at point 36. The dc voltage between the anode and cathode is sufficient to cause breakdown of the gas and the formation of positive ions 41 therein. The electric field will urge these ions toward the cathode, as indicated by the arrows below the ions 41. The resonator being etched, 31, rests on the cathode 29. The resonator will have the two IDTs and the strips 19 already formed thereon, as stated above. In accordance with the invention, all of the conductors comprising the IDT electrodes are connected to a source of positive bias, $+V_b$. This bias is made large enough to prevent any substantial ionic etching of the IDT electrodes, or the quartz areas around them. The positive bias on these electrodes will either not attract or will actually repel the positive ions 41, which are bombarding all of the unbiased portions of the resonator and the cathode 29. The bias leads, $+V_b$, pass through cathode 29 by means of feedthrough insulators 45 and 47. With IDTs of the types shown in FIG. 1, the bias leads must be attached to all four of the conductors patterns which make up the two IDTs. Thus each of the bias leads $+V_b$ of FIG. 4 are split to provide four attachment points. The ends of these bias leads may be provided with small permanent magents 49, which hold the leads onto the aluminum IDT electrodes. A single larger magnet large enough to contact all four of the IDT conductors may also be used, in which case only a single bias lead is necessary.

The apparatus of FIG. 4 can be used for reactive-ion etching simply by chosing a gas such as freon ($CF_4$) which will react with the quartz of the resonator substrate to speed the etching process. Also the gas discharge may be energized by a radio frequency generator, 39 connected to the cathode via coupling capacitor 37 and inner conductor 34. This RF voltage results in increased ion production and hence hastens the etching process.

After the resonator 31 is removed from the chamber of FIG. 4, it is usually desirable to remove the masking strips 19 by a further etching step or by other means. The resonator is then ready for testing and use.

While the invention has been illustrated in connection with the fabrication of a certain type of microelectronic device, the process is of general application and can be used in the fabrication of any device which requires electrical masking of selected parts during ionic etching. Accordingly, the invention should be limited only by the scope of the appended claims.

What is claimed is:

1. In a method of ionic etching of a microelectric device in a glow discharge chamber, said method comprising the step of electrically masking conductive areas of said microelectronic device by connecting a suitable bias thereto, whereby said conductive areas and the regions around them will be shielded from ionic bombardment.

2. The method of claim 1 wherein said microelectronic device is a surface acoustic wave resonator comprising a pair of interdigital transducer electrodes and a pair of grooved array reflectors and wherein the grooves of said reflectors are ionically etched in said chamber and said conductive areas comprise said interdigital transducer electrodes.

3. The method of claim 2 wherein said chamber comprises a cathode and an anode and wherein said microelectronic device rests on said cathode during the practice of said method.

4. In a method of reaction-ion etching or microelectronic structures which comprise metallic areas which are desired to be shielded from ion bombardment and consequent etching, comprising the step of electrically masking said metallic areas by applying thereto a positive bias, so that said metallic areas and the nearby regions of the substrate of said microelectronic structure will be shielded from ion bombardment.

5. A method of selective etching of features on a crystal substrate by means of ionic bombardment in an etching chamber in which a glow discharge is maintained to produce a plasma comprising positive ions, and in which said substrate is placed on the cathode in said etching chamber, said method comprising the step of electrically masking conductive areas on said substrate by connecting thereto a source of positive bias, whereby said conductive areas and the regions of said substrate near said areas will be shielded from said ion bombardment.

6. A method of electrically masking selected conductive areas on a crystal substrate which is being ionically etched by means of a plasma produced by a glow discharge, by connecting said conductive areas to a source of positive bias.

* * * * *